(12) United States Patent
Kim et al.

(10) Patent No.: US 9,140,747 B2
(45) Date of Patent: Sep. 22, 2015

(54) SENSE AMPLIFIER OFFSET VOLTAGE REDUCTION

(71) Applicant: QUALCOMM Incorporated, San Diego, CA (US)

(72) Inventors: Jung Pill Kim, San Diego, CA (US); Taehyun Kim, San Diego, CA (US); Sungryul Kim, San Diego, CA (US); Daeik D. Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/947,144

(22) Filed: Jul. 22, 2013

(65) Prior Publication Data

US 2015/0022264 A1    Jan. 22, 2015

(51) Int. Cl.
| | | |
|---|---|---|
| *G11C 7/00* | (2006.01) | |
| *G01R 31/28* | (2006.01) | |
| *G11C 29/14* | (2006.01) | |
| *G11C 29/44* | (2006.01) | |
| *G11C 29/46* | (2006.01) | |
| *G11C 16/28* | (2006.01) | |
| *G11C 29/02* | (2006.01) | |

(52) U.S. Cl.
CPC ............ *G01R 31/2851* (2013.01); *G11C 16/28* (2013.01); *G11C 29/02* (2013.01); *G11C 29/026* (2013.01); *G11C 29/028* (2013.01); *G11C 29/14* (2013.01); *G11C 29/44* (2013.01); *G11C 29/46* (2013.01)

(58) Field of Classification Search
CPC ........ G11C 16/28; G11C 29/02; G11C 29/14; G11C 29/44; G11C 29/46

USPC ................ 365/185.2, 185.22, 185.29, 185.3, 365/185.24, 189.07, 200, 201, 236

See application file for complete search history.

(56) References Cited

U.S. PATENT DOCUMENTS

| | | | | |
|---|---|---|---|---|
| 5,615,159 | A | * | 3/1997 | Roohparvar ............. 365/185.07 |
| 5,801,985 | A | * | 9/1998 | Roohparvar et al. .... 365/185.01 |
| 5,880,996 | A | * | 3/1999 | Roohparvar ............. 365/185.33 |
| 6,272,586 | B1 | * | 8/2001 | Roohparvar et al. ......... 711/103 |
| RE37,611 | E | * | 3/2002 | Roohparvar ............. 365/185.22 |
| 6,791,890 | B2 | * | 9/2004 | Ooishi ..................... 365/189.15 |
| 6,990,030 | B2 | * | 1/2006 | Lemus et al. ................. 365/209 |
| 7,239,537 | B2 | * | 7/2007 | DeBrosse et al. ............. 365/154 |
| 7,453,719 | B2 | | 11/2008 | Sakimura et al. |
| 7,518,934 | B2 | | 4/2009 | Bedeschi et al. |
| 8,228,709 | B2 | | 7/2012 | Choi |

(Continued)

OTHER PUBLICATIONS

Partial International Search Report for International Application No. PCT/US2014/045689, ISA/EPO, Date of Mailing, Nov. 21, 2014, 6 pages.

(Continued)

*Primary Examiner* — Gene Auduong
(74) *Attorney, Agent, or Firm* — Toler Law Group, PC

(57) ABSTRACT

A circuit includes a plurality of transistors responsive to a plurality of latches that store a test code. The circuit further includes a first bit line coupled to a data cell and coupled to a sense amplifier. The circuit also includes a second bit line coupled to a reference cell and coupled to the sense amplifier. A current from a set of the plurality of transistors is applied to the data cell via the first bit line. The set of the plurality of transistors is determined based on the test code. The circuit also includes a test mode reference circuit coupled to the first bit line and to the second bit line.

27 Claims, 7 Drawing Sheets

(56) References Cited

U.S. PATENT DOCUMENTS

| | | |
|---|---|---|
| 8,243,542 B2 | 8/2012 | Bae et al. |
| 8,248,864 B2 * | 8/2012 | Ikeda et al. ............. 365/189.05 |
| 8,406,033 B2 | 3/2013 | Lung et al. |
| 2003/0103395 A1 | 6/2003 | Ooishi |
| 2005/0083748 A1 | 4/2005 | Lemus et al. |
| 2006/0152970 A1 | 7/2006 | DeBrosse et al. |
| 2011/0019493 A1 | 1/2011 | Ikeda et al. |
| 2013/0058172 A1 | 3/2013 | Rao et al. |

OTHER PUBLICATIONS

Chen, Y., et al., "A 130 nm 1.2 V/3.3 V 16 Kb Spin-Transfer Torque Random Access Memory with Nondestructive Self-Reference Sensing Scheme," IEEE Journal of Solid State Circuits, Nov. 7, 2011, vol. 47, No. 2, IEEE, Piscataway, NJ, pp. 560-573.

International Search Report and Written Opinion for International Application No. PCT/US2014/045689, ISA/EPO, Date of Mailing Mar. 11, 2015, 19 pages.

\* cited by examiner

SENSE AMPLIFIER OFFSET VOLTAGE REDUCTION

I. FIELD

The present disclosure is generally related to characterization of and compensation for sense amplifier voltage offset.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. These wireless telephones may also include memory devices, such as a spin-transfer torque magnetoresistive random-access memory (STT-MRAM) for memory storage.

Each data cell within an STT-MRAM may be programmed by a spin-polarized current that flows through a magnetic tunnel junction (MTJ) device. For example, when a switching current flows through the MTJ device, a direction of magnetic moment of a free layer of the MTJ device may change in relation to a direction of a magnetic moment of a pinned layer of the MTJ device (e.g., from a parallel state to an anti-parallel state). The MTJ device may have a higher resistance when the direction of the free layer is anti-parallel to the direction of the pinned layer as compared to a lower resistance when the direction of the free layer is parallel to the direction of the pinned layer. The change in direction of the free layer may correspond to a logic value of a data cell changing from a logical "0" to a logical "1."

When reading (i.e., sensing) the logic value of the data cell during a read operation, process variations of devices in a sense amplifier may result in an offset voltage between a data branch associated with the data cell and a reference branch associated with a reference cell. The offset voltage may reduce the sensing margin between the data cell and the reference cell and may thus cause errors when comparing an output voltage corresponding to the data cell with an output voltage corresponding to the reference cell.

III. SUMMARY

A method and an apparatus for reducing a voltage offset in a sense amplifier are disclosed. A memory system may scan through a plurality of codes and monitor an output of the sense amplifier for each code to determine a particular code (e.g., an offset compensation code) that compensates for voltage offsets in the sense amplifier. For example, during a test mode, a first bit line associated with a data cell may be coupled to a first resistor and a second bit line associated with a reference cell may be coupled to a second resistor having a substantially equal resistance as the first resistor. Each code may vary (e.g., increase or decrease) an amount of current propagating through one of the bit lines while a substantially constant current propagates through the other bit line. A comparator may compare a test data voltage with a test reference voltage to determine the particular code resulting in the test data voltage increasing from less than the test reference voltage to greater than the test reference voltage, transitioning across a state where the test data voltage and the test reference voltage are substantially equal. The test data voltage may be proportional to the resistance of the first resistor multiplied by the current propagating through the first bit line, and the test reference voltage may be proportional to the resistance of the second resistor multiplied by the current propagating through the second bit line. In response to determining the particular code, the memory system may enter into a sensing mode by coupling the first bit line to the data cell and by coupling the second bit line to the reference cell. The particular code may be used to generate a current at the first bit line that compensates (e.g., reduces) the voltage offset in the sense amplifier during sensing operations.

In a particular embodiment, a circuit includes a plurality of transistors responsive to a plurality of latches that store a test code. The circuit further includes a first bit line coupled to a data cell and coupled to a sense amplifier. The circuit also includes a second bit line coupled to a reference cell and coupled to the sense amplifier. A current from a set of the plurality of transistors is applied to the data cell via the first bit line. The set of the plurality of transistors is determined based on the test code. The circuit also includes a test mode reference circuit coupled to the first bit line and to the second bit line.

In another particular embodiment, a method includes providing a test code to a plurality of latches that are coupled to a plurality of transistors. The method also includes applying a current from a set of the plurality of transistors to a bit cell via a first bit line. The set of the plurality of transistors is determined based on the test code. The test code is determined based on an output of a sense amplifier provided during operation of the sense amplifier in a test mode.

In another particular embodiment, an apparatus includes means for latching a test code. The apparatus also includes means for providing a current to a first bit line to read a bit cell via based on the latched test code. The test code is determined based on an output of a sense amplifier provided during operation of the sense amplifier in a test mode.

One particular advantage provided by at least one of the disclosed embodiments is a reduction in errors when comparing an output voltage corresponding to a data cell with an output voltage corresponding to a reference cell. For example, a voltage offset of a sense amplifier (e.g., due to process variations during manufacturing) may be removed or reduced. Reducing the voltage offset may result in fewer errors when the sense amplifier compares the output voltage corresponding to the data cell with the output voltage corresponding to the reference cell.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
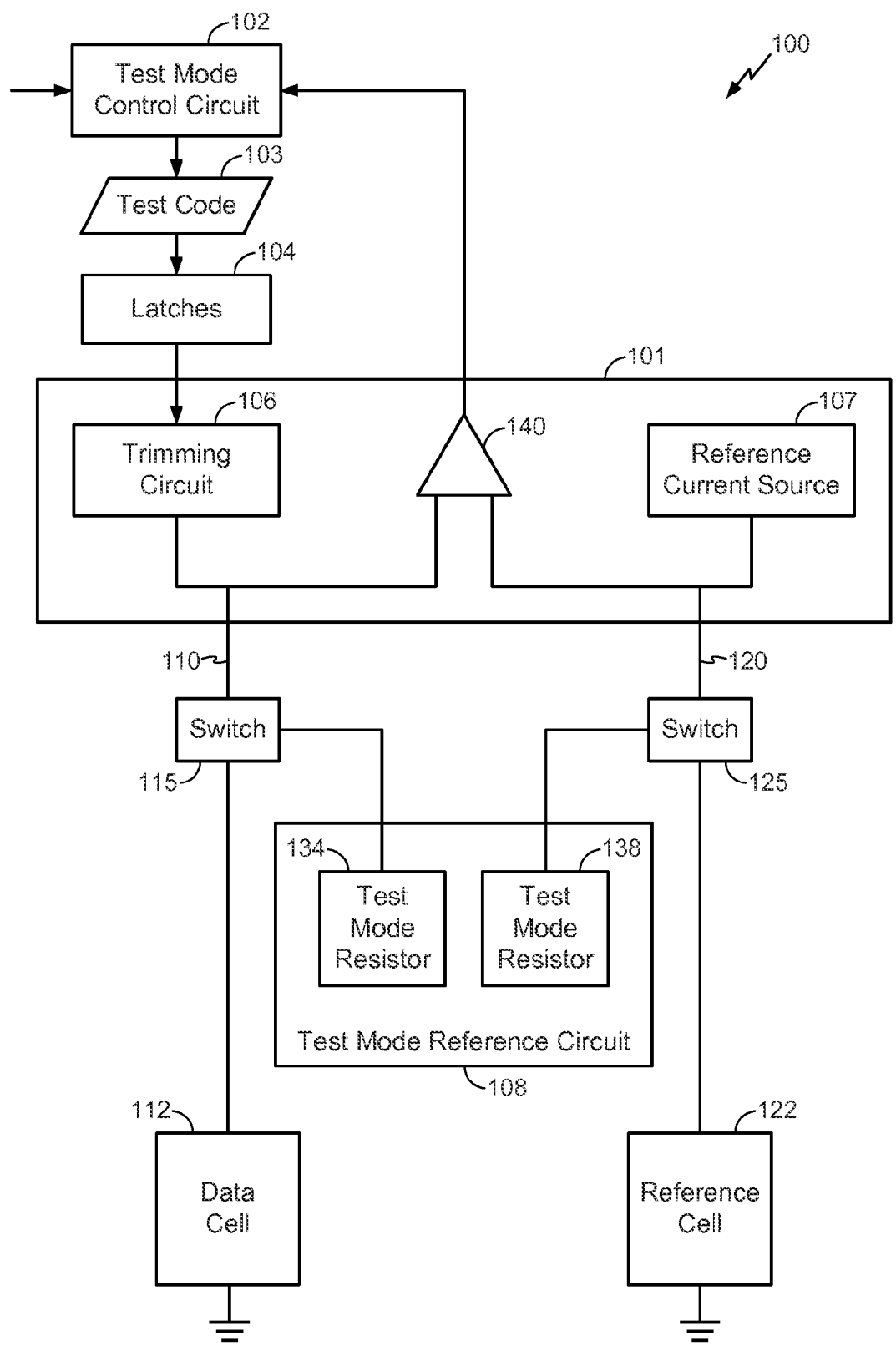
FIG. 1 is a block diagram of a particular illustrative embodiment of a memory system that is operable to reduce or cancel a voltage offset during sensing operations.

Referring to FIG. 1, a particular illustrative embodiment of a memory system 100 that is operable to reduce or cancel a voltage offset during sensing operations is shown. The memory system 100 includes a sense amplifier 101, a test mode control circuit 102, a plurality of latches 104, a test mode reference circuit 108, a data cell 112, and a reference cell 122. The sense amplifier 101 includes a trimming circuit 106, a reference current source 107, and a comparator 140.

The data cell 112 may be a memory cell within a magnetoresistive random access-memory (MRAM), a phase change random access memory (PRAM), a spin-transfer torque magnetoresistive random-access memory (STT-MRAM), a ferroelectric random-access memory (FRAM), or a resistive random-access memory (ReRAM), as illustrative, non-limiting examples. For example, the data cell 112 may be a memory cell within a non-volatile memory. The data cell 112 includes a programmable resistance based memory element. In a particular embodiment, the programmable resistance based memory element includes a magnetic tunnel junction (MTJ) device. A resistance of the programmable resistance based memory element may be based on a data value that is written to the programmable resistance based memory element via a current (e.g., a write current) provided to the programmable resistance based memory element. The reference cell 122 includes a reference resistance based memory element.

The test mode control circuit 102 may be configured to provide a test code 103 to the plurality of latches 104 in response to receiving an enable signal. For example, the test code 103 may be provided to the plurality of latches 104 by serially shifting test code 103 into the plurality of latches 104. To illustrate, the test code 103 may be provided to the plurality of latches 104 via a scan input. In a particular embodiment, the test mode control circuit 102 may provide a series of test codes to the plurality of latches 104 to determine a characteristic of the sense amplifier 101. For example, as explained below, the test mode control circuit 102 may provide the series of test codes to the plurality of latches 104 to determine an extent of manufacturing process variations of components in the sense amplifier 101. The test code 103 may include logic one values and logic zero values. For example, as explained with respect to FIG. 2, the plurality of latches 104 may correspond to a plurality of D-type flip-flops (DFFs). Each bit of the test code 103 may be shifted into a corresponding DFF. For example, a logic zero bit (e.g., a low voltage signal) or a logic one bit (e.g., a high voltage signal) may be shifted into DFFs in the plurality of latches 104.

The trimming circuit 106 may be configured to adjust (e.g., reduce or increase) an amount of current provided to a first bit line 110 based on the test code 103. The trimming circuit 106 may include a plurality of transistors that selectively adjust an amount of current provided to the first bit line 110 based on the test code 103, as described in further detail with respect to FIG. 2. For example, the trimming circuit 106 may include degeneration transistors and load transistors that are selectively activated based on outputs from the plurality of latches 104. Each bit (in the test code 103) having a low logic value may be provided to corresponding latches, and the corresponding latches may activate corresponding transistors in the trimming circuit 106 to increase an amount of current provided to the first bit line 110. In addition, each bit having a high logic level value may be provided to corresponding latches, and the corresponding latches may deactivate corresponding transistors in the trimming circuit 106 to decrease an amount of current provided to the first bit line 110. Thus, the amount of current provided to the first bit line 110 is based on a value of the test code 103.

The reference current source 107 may include at least one degeneration transistor and at least one load transistor that are configured to provide a current to a second bit line 120. In a particular embodiment, the reference current source 107 may provide a substantially constant current to the second bit line 120.

The comparator 140 may be configured to determine a logic value of the data cell 112 based on a data voltage and a reference voltage. For example, the data voltage may correspond to a voltage applied to a first input of the comparator 140 via the first bit line 110, and the reference voltage may correspond to a voltage applied to a second input of the comparator 140 via the second bit line 120. The logic value of the data cell 112 may correspond to a first value (i.e., a logical "0" value) when the data voltage is less than the reference voltage. The logic value of the data cell 112 may correspond to a second value (i.e., a logical "1" value) when the data voltage is greater than the reference voltage.

The test mode reference circuit 108 includes a first test mode resistor 134 and a second test mode resistor 138. In a particular embodiment, the first test mode resistor 134 may have a resistance that is substantially equal to a resistance of the second test mode resistor 138. The memory system 100 also includes a first switch 115 and a second switch 125. During operation of the memory system 100 in a sensing mode, the first switch 115 may be configured to couple the sense amplifier 101 to the data cell 112 via the first bit line 110, isolating the first test mode resistor 134 from the sense amplifier 101. During operation of the memory system 100 in a test mode, the first switch 115 may be configured to couple the sense amplifier 101 to the first test mode resistor 134 via the first bit line 110, isolating the data cell 112 from the sense amplifier 101. In a similar manner, the second switch 125 may be configured to couple the sense amplifier 101 to the reference cell 122 via the second bit line 120 during operation of the memory system 100 in the sensing mode, isolating the second test mode resistor 138 from the sense amplifier 101. During operation of the memory system 100 in the test mode, the second switch 125 may be configured to couple the sense amplifier 101 to the second test mode resistor 138 via the second bit line 120, isolating the reference cell 122 from the sense amplifier 101.

During operation in the test mode, the memory system 100 may adjust the current generated by the trimming circuit 106 to compensate for voltage offsets that may be present in the sense amplifier 101. For example, in the test mode, the first switch 115 may couple the first bit line 110 to the first test mode resistor 134, and the second switch 125 may couple the second bit line 120 to the second test mode resistor 138, electrically coupling the first and second test mode resistors 134, 138, respectively, to inputs of the sense amplifier 101. As a result, the data cell 112 and the reference cell 122 may be electrically isolated from the sense amplifier 101.

Different test codes 103 may be provided to the plurality of latches 104. As a result, different sets of transistors in the trimming circuit 106 may be activated for each test code 103, resulting in different currents being provided to the first test mode resistor 134 via the first bit line 110. For each current provided to the first test mode resistor 134, a corresponding test data voltage may be generated and provided to the first input of the comparator 140 via the first bit line 110. In the test mode, a substantially constant current may be provided to the second test mode resistor 138 via the reference current source 107. As a result, a substantially constant test reference voltage may be generated and provided to the second input of the comparator 140 via the second bit line 120. An output (e.g., a sense amplifier output signal) of the comparator 140 may be provided to the test mode control circuit 102. The test mode control circuit 102 may store the test code 103 (e.g., an offset compensation code) that causes the output of the comparator 140 to toggle. For example, the output of the comparator 140 may toggle when the test data voltage increases from less than the test reference voltage to greater than the test reference voltage, transitioning across a state where the test data voltage and the test reference voltage are substantially equal. In another particular embodiment, the offset compensation code may correspond to a test code 103 that does not cause the output of the comparator 140 to toggle while generating a test data voltage that is substantially equal to the test reference voltage. For example, the offset compensation code may correspond to a first test code that results in the test data voltage being less than the test reference voltage, where a second test code (e.g., a next test code in the progression of scanned test codes) would cause the test data voltage to increase from less than the test reference voltage to greater than the test reference voltage. Thus, the offset compensation code may correspond to a code that, when provided to the plurality of latches 104, causes the trimming circuit 106 to generate an offset current that substantially compensates for voltage offsets in the sense amplifier 101. For example, the offset current may correspond to the current that is provided to the first test mode resistor 134 that causes the test data voltage to be substantially equal to the test reference voltage. In a particular embodiment, the offset compensation code may be stored in the plurality of latches 104.

After determining the offset compensation code, the memory system 100 may enter into the sensing mode. During operation of the memory system 100 in the sensing mode, the first switch 115 may couple the first bit line 110 to the data cell 112, and the second switch 125 may couple the second bit line 120 to the reference cell 122, electrically coupling the data cell 112 and the reference cell 122, respectively, to inputs of the sense amplifier 101. As a result, the first and second test mode resistors 134, 138 may be electrically isolated from the sense amplifier 101.

The offset compensation code determined in the test mode may be provided (e.g., serially shifted) to the plurality of latches 104. The plurality of latches 104 may provide corresponding voltage signals to a set of transistors in the trimming circuit 106 to produce a current (e.g., an offset current) that is substantially similar to the current that caused the test data voltage to substantially equal the test reference voltage. The offset current may be provided to the data cell 112 via the first bit line 110. A data voltage may be generated based on the offset current and a resistance of the programmable resistance based memory element in the data cell 112. A reference voltage may be generated based on the resistance of the reference resistance based memory element in the reference cell 122 and the current provided via the second bit line 120. The comparator 140 may compare the data voltage to the reference voltage to determine a logical value of the data cell 112.

It will be appreciated that the memory system 100 may remove or reduce a voltage offset due to manufacturing process variations of components in the sense amplifier 101. For example, using the test codes 103 to vary (e.g., increase or decrease) the current provided to the data cell 112 may eliminate or reduce a voltage offset that may otherwise be present. During operation of the memory system 100 in the sensing mode, any voltage offset due to manufacturing process variations of components in the sense amplifier 101 may be reduced or canceled using the offset compensation code determined during the test mode. For example, the test mode control circuit 102 may scan through different test codes 103 until the offset compensation code is determined. The memory system 100 may then switch to sensing mode, and the test mode control circuit 102 may apply the offset compensation code to the plurality of latches 104 to reduce voltage offsets in the sense amplifier 101.

Although the trimming circuit 106 is depicted to vary the current provided to the data cell 112 to eliminate or reduce a voltage offset, it will be appreciated that in another embodiment, a trimming circuit may vary the current provided to the reference cell 122 and a data current source may provide a substantially current to the data cell 112 to eliminate or reduce the voltage offset.

Figure 2:
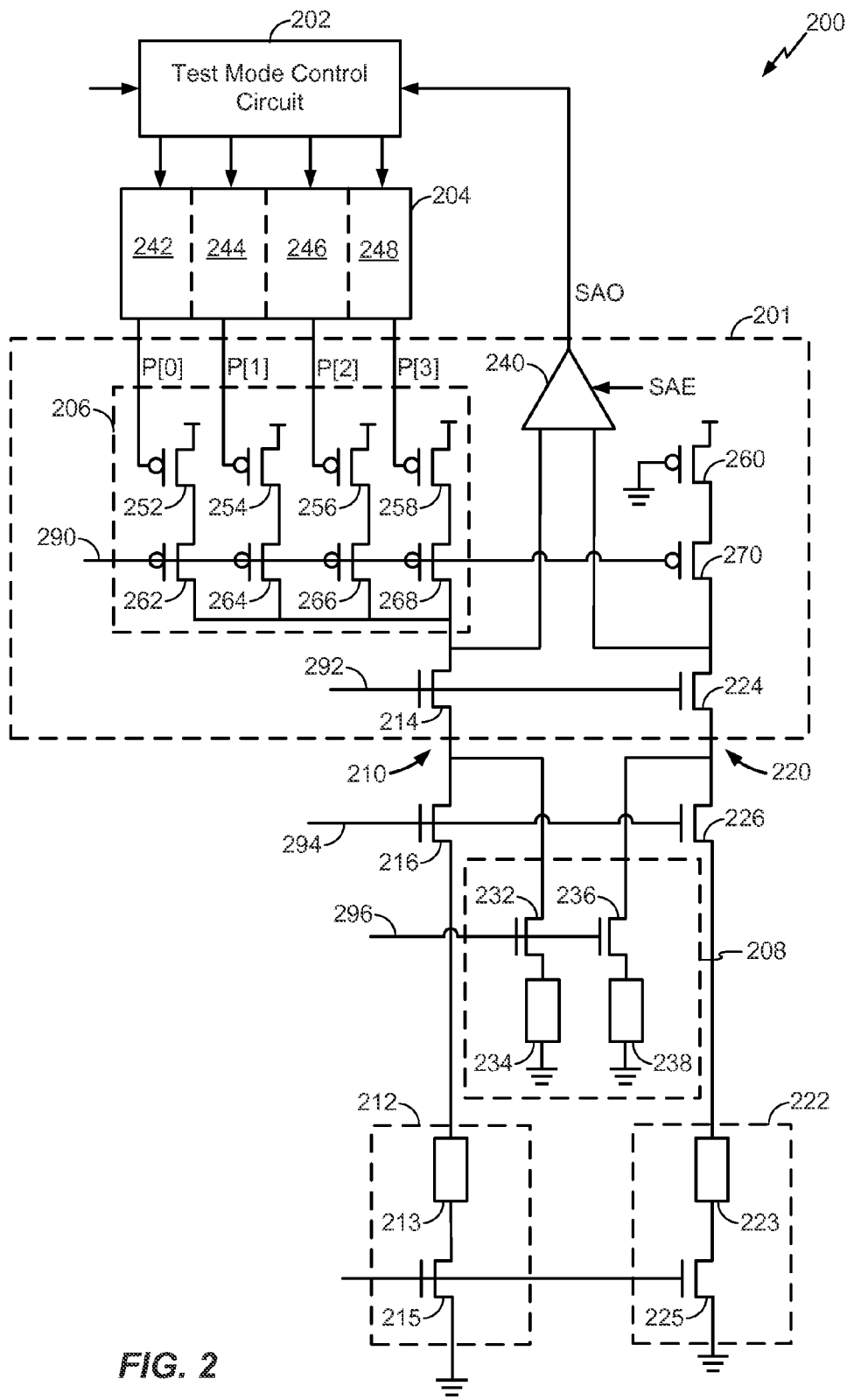
FIG. 2 is a circuit diagram of a particular illustrative embodiment of a memory system that is operable to reduce or cancel a voltage offset during sensing operations.

Referring to FIG. 2, a particular illustrative embodiment of a memory system 200 that is operable to reduce or cancel a voltage offset during sensing operations is shown. The memory system 200 includes a sense amplifier 201, a test mode control circuit 202, a plurality of latches 204, a test mode reference circuit 208, a data cell 212, and a reference cell 222. The sense amplifier 201, the test mode control circuit 202, the plurality of latches 204, the test mode reference circuit 208, the data cell 212, and the reference cell 222 may correspond to the sense amplifier 101 of FIG. 1, the test mode control circuit 102 of FIG. 1, the plurality of latches 104 of FIG. 1, the test mode reference circuit 108 of FIG. 1, the data cell 112 of FIG. 1, and the reference cell 122 of FIG. 1, respectively, and may operate in substantially similar manner.

The data cell 212 includes a programmable resistance based memory element 213 and an access transistor 215. The programmable resistance based memory element 213 may be coupled to a drain of the access transistor 215, and a source of the access transistor 215 may be coupled to ground. In a particular embodiment, the programmable resistance based memory element 213 includes a magnetic tunnel junction (MTJ) device. A resistance of the programmable resistance based memory element 213 may be based on a data value that is written to the programmable resistance based memory element 213 via a current (e.g., a write current) provided to the programmable resistance based memory element 213. As illustrative, non-limiting examples, the data cell 212 may be a memory cell within a magnetoresistive random access-memory (MRAM), a phase change random access memory (PRAM), or a spin-transfer torque magnetoresistive random-access memory (STT-MRAM).

The reference cell 222 includes a reference resistance based memory element 223 and an access transistor 225. The reference resistance based memory element 223 may be coupled to a drain of the access transistor 225, and a source of the access transistor 225 may be coupled to ground. In a particular embodiment, the access transistors 215, 225 are n-type metal oxide semiconductor (NMOS) transistors, and the gates of the access transistors 215, 225 are coupled to a common enable line.

The test mode control circuit 202 may be configured to provide a test code to the plurality of latches 204 in response to receiving an enable signal. For example, the test code may be provided to the plurality of latches 204 by serially shifting test code values into the plurality latches 204. To illustrate, the test code may be provided to the plurality of latches 204 via a scan input. The test code may include logic one values and logic zero values. In a particular embodiment, each latch included in the plurality of latches 204 may correspond to a D-type flip-flop (DFF). For example, the plurality of latches 204 may include a first DFF 242, a second DFF 244, a third DFF 246, and a fourth DFF 248. Each DFF 242-248 may be responsive to a corresponding bit of the test code. For example, a logic zero bit (e.g., a low voltage signal) or a logic one bit (e.g., a high voltage signal) may be shifted into each DFF 242-248.

The sense amplifier 201 includes a trimming circuit 206 and a comparator 240. The trimming circuit 206 may include a plurality of transistors. For example, the trimming circuit 206 may include a first degeneration transistor 252, a second degeneration transistor 254, a third degeneration transistor 256, and a fourth degeneration transistor 258. Each degeneration transistor 252-258 may be a p-type metal oxide semiconductor (PMOS) transistor and may be responsive to an output signal P[0]-P[3] of the corresponding DFF 242-248. For example, the first degeneration transistor 252 may conduct in response to the first DFF 242 outputting a low voltage signal (e.g., a logic zero value) and may deactivate in response to the first DFF 242 outputting a high voltage signal (e.g., a logic one value). The remaining degeneration transistors 254-258 may operate in a substantially similar manner in response to the outputs of the remaining DFFs 244-248. In a particular embodiment, each degeneration transistor 252-258 may have distinct characteristics (e.g., width, length, threshold voltages, etc.) to generate different currents in response to conduction. For example, the first degeneration transistor 252 may conduct a first current, the second degeneration transistor 254 may conduct a second current that is greater than the first current, the third degeneration transistor 256 may conduct a third current that is greater than the second current, etc.

The trimming circuit 206 may also include a first load transistor 262, a second load transistor 264, a third load transistor 266, and a fourth load transistor 268. Each load transistor 262-268 may be a PMOS transistor and may be responsive to a load enable signal applied to a gate of each load transistor 262-268 via a first enable line 290 coupled to the gate of each load transistor 262-268. For example, in response to the load enable signal having a low voltage level, conduction may be enabled for each load transistor 262-268. In the illustrated embodiment, the trimming circuit 206 is associated with a data branch 210 (e.g., a first bit line coupled to the data cell 212). In another embodiment, the trimming circuit 206 may be associated with a reference branch 220 (e.g., a second bit line coupled to the reference cell 222).

The sense amplifier 201 may also include a first clamp transistor 214, a second clamp transistor 224, a fifth degeneration transistor 260, and a fifth load transistor 270. In a particular embodiment, the fifth degeneration transistor 260 and the fifth load transistor 270 are PMOS transistors and are associated with the reference branch 220. In a particular embodiment, the first clamp transistor 214 and the second clamp transistor 224 are NMOS transistors. A second enable line 292 may be coupled to a gate of the first clamp transistor 214 and to a gate of the second clamp transistor 224. The first clamp transistor 214 may be coupled to the trimming circuit 206 and the second clamp transistor 224 may be coupled to the fifth load transistor 270. The first enable line 290 may also be coupled to a gate of the fifth load transistor 270. A data voltage may be generated at a drain of the first clamp resistor 214. During operation in the sensing mode, the data voltage is proportional to the total current generated from the trimming circuit 206 and the resistance of the programmable resistance based memory element 213. Further, during operation in the sensing mode, a reference voltage may be generated at a drain of the second clamp resistor 224 that is proportional to the current generated at the reference branch 220. The comparator 240 may be configured to determine a logic value of the data cell 212 based on the data voltage and the reference voltage. For example, in response to a sense amplifier enable signal (SAE), the comparator 240 may compare the data voltage with the reference voltage. The logic value of the data cell 212 may correspond to a first value (e.g., a logical "0" value) when the data voltage is less than the reference voltage. The logic value of the data cell 212 may correspond to a second value (e.g., a logical "1" value) when the data voltage is greater than the reference voltage.

The test mode reference circuit 208 includes a first selection transistor 232, a first test mode resistor 234, a second selection transistor 236, and a second test mode resistor 238. In a particular embodiment, the first and second selection transistors 232, 236 are NMOS transistors. A first terminal of the first test mode resistor 234 may be coupled to ground, and a second terminal of the first test mode resistor 234 may be coupled to a source of the first selection transistor 232. A drain of the first selection transistor 232 may be coupled to a source of the first clamp transistor 214. A first terminal of the second test mode resistor 238 may be coupled to ground, and a second terminal of the second test mode resistor 238 may be coupled to a source of the second selection transistor 236. A drain of the second selection transistor 236 may be coupled to a source of the second clamp transistor 224. The first test mode resistor 234 and the second test mode resistor 238 may have substantially equal resistances.

During operation of the memory system 200 in a test mode, the memory system 200 may adjust the current generated by the trimming circuit 206 to compensate for voltage offsets that may be present in the sense amplifier 201. For example, in the test mode, a low voltage signal may be applied to the gates of a first read select transistor 216 and a second read select transistor 226 via a third enable line 294, isolating the data cell 212 and the reference cell 222, respectively, from the sense amplifier 201. Additionally, a high voltage signal may be applied to the gates of the first and second selection transistors 232, 236, which may electrically couple the first and second test mode resistors 234, 238, respectively, to the sense amplifier 201.

Different test codes may be provided to the plurality of latches 204. A different set of the transistors 252-258 may be activated for each test code, resulting in different currents being provided to the first test mode resistor 234. For each current provided to the first test mode resistor 234, a corresponding test data voltage may be generated and provided to the comparator 240 via the data branch 210. In the test mode, a substantially constant current may be provided to the second test mode resistor 238 via the fifth degeneration transistor 260 and the fifth load transistor 270. As a result, a substantially constant test reference voltage may be generated and provided to the comparator 240 via the reference branch 220.

An output (SAO) of the comparator 240 may be provided to the test mode control circuit 202. The test mode control circuit 202 may store the test code (e.g., an offset compensation code) that causes the output of the comparator 240 to toggle. For example, the output of the comparator 240 may toggle when the test data voltage increases from less than the test reference voltage to greater than the test reference voltage, transitioning across a state where the test data voltage and the test reference voltage are substantially equal. In another particular embodiment, the offset compensation code may correspond to a test code 103 that does not cause the output of the comparator 140 to toggle while generating a test data voltage that is substantially equal to the test reference voltage. For example, the offset compensation code may correspond to a first test code that results in the test data voltage being less than the test reference voltage, where a second test code (e.g., a next test code in the progression of scanned test codes) would cause the test data voltage to increase from less than the test reference voltage to greater than the test reference voltage. Thus, the offset compensation code may correspond to a code that, when provided to the plurality of latches 204, causes the trimming circuit 206 to generate an offset current that substantially compensates for voltage offsets in the sense amplifier 201. For example, the offset current may correspond to the current that is provided to the first test mode resistor 234 that causes the test data voltage to be substantially equal to the test reference voltage. In a particular embodiment, the offset compensation code may be stored in the plurality of latches 204. In another particular embodiment, the offset compensation code may be stored in a one-time programmable memory, such as described with respect to FIG. 4. In yet another embodiment, the offset compensation code may be stored in a second magnetoresistive random-access memory (MRAM) cell array, such as described with respect to FIG. 4. For example, the data cell 212 may be included in a first MRAM cell array and the second MRAM cell array may be a spare MRAM cell array that is adjacent to the first MRAM cell array.

After determining the offset compensation code, the memory system 200 may enter into a sensing mode. During operation of the memory system 200 in the sensing mode, a low voltage signal may be applied to the gates of the first and second selection transistors 232, 236 via the fourth enable line 296, isolating the first test mode reference circuit 208 from the sense amplifier 201. In addition, a high voltage signal may be applied to the gates of the first and second read select transistors 216, 226, which may electrically couple the programmable resistance based memory element 213 and the reference resistance based memory element 223, respectively, to the sensing circuit 201.

If the off et compensation code is stored in the one-time programmable memory or the second MRAM array, the offset compensation code may be provided (e.g., transferred) to the plurality of latches 204. The offset compensation code may be provided to the plurality of latches 204 to enable selected degeneration transistors 252-258 to produce a current (e.g., an offset current) that is substantially similar to the current that caused the test data voltage to substantially equal the test reference voltage. The offset current may be provided to the programmable resistance based memory element 213 via the data branch 210. A data voltage may be generated based on the offset current and the resistance of the programmable resistance based memory element 213. A reference voltage may be generated based on the resistance of the reference resistance based memory element 223 and the current provided via the reference branch 220. The comparator 240 may compare the data voltage to the reference voltage to determine a logical value of the data cell 212.

It will be appreciated that the memory system 200 may remove or reduce a voltage offset due to manufacturing process variations of components in the sense amplifier 201. For example, using the test codes to vary (e.g., increase or decrease) the current provided to the programmable resistance based memory element 213 may eliminate or reduce a voltage offset that may otherwise be present. During operation of the memory system 200 in the sensing mode, any voltage offset due to manufacturing process variations of components in the sense amplifier 201 may be reduced or canceled using the offset compensation code determined during the test mode. For example, the test mode control circuit 202 may scan through different test codes until the offset compensation code is determined. The memory system 200 may then switch to sensing mode, and the test mode control circuit 202 may apply the offset compensation code to the plurality of latches 204 to reduce voltage offsets in the sense amplifier 201.

Figure 3:
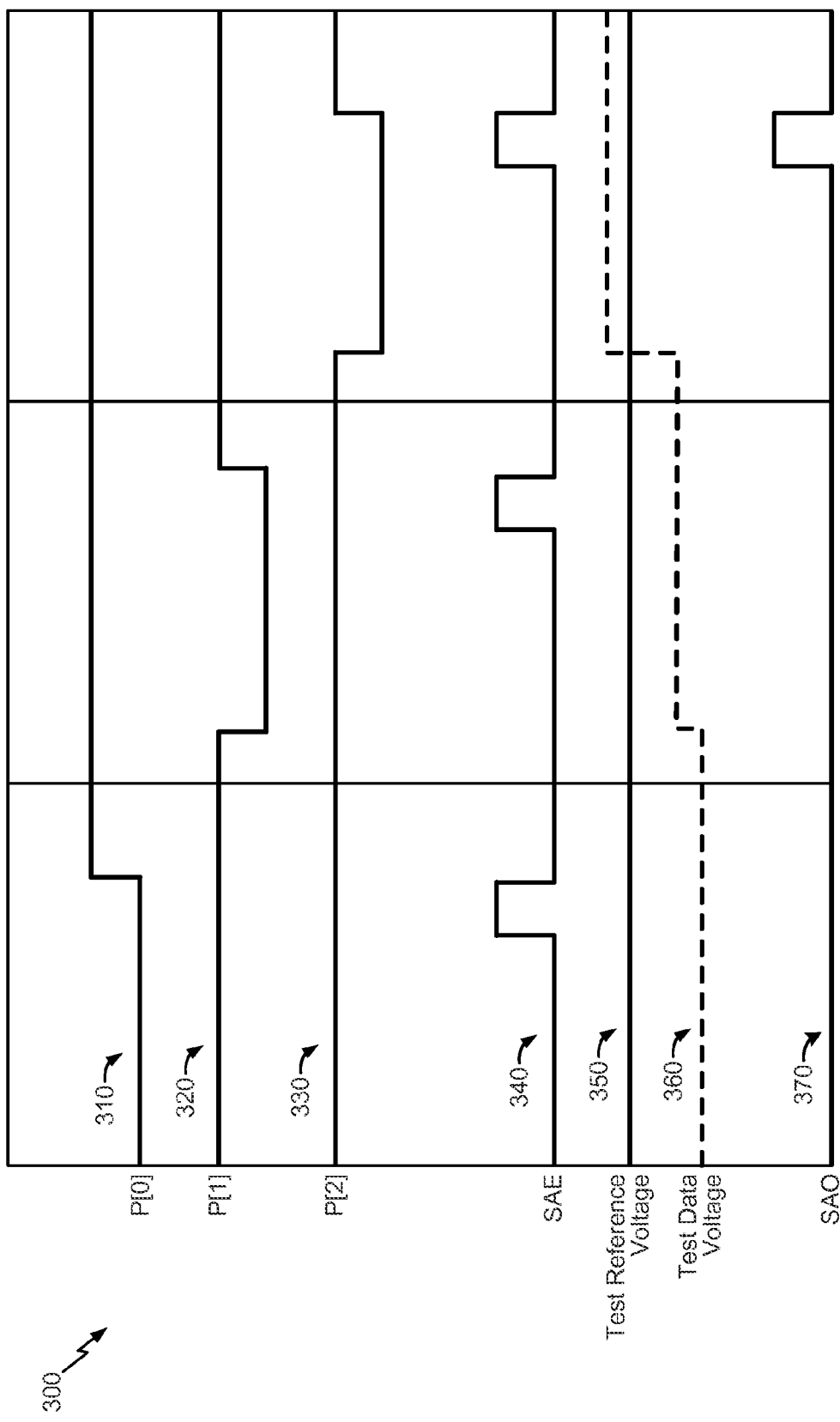
FIG. 3 is a timing diagram of a particular illustrative embodiment of a memory system during test mode.

Referring to FIG. 3, a timing diagram 300 of a particular illustrative embodiment of a memory system during test mode. For example, the timing diagram 300 may correspond to the memory system 100 of FIG. 1, the memory system 200 of FIG. 2, or any combination thereof. For ease of explanation, the timing diagram 300 will be explained with respect to the memory system 200 of FIG. 2.

The timing diagram 300 includes a first trace 310, a second trace 320, a third trace 330, a fourth trace 340, a fifth trace 350, a sixth trace 360, and a seventh trace 370. The first trace 310 corresponds to a voltage of level of the first output signal P[0] of the first DFF 242, the second trace 320 corresponds to a voltage level of the second output signal P[1] of the second DFF 244, and the third trace 330 corresponds to a voltage level of the third output signal P[2] of the third DFF 246. The fourth trace 340 corresponds to a voltage level of the sense enable signal (SAE). The fifth trace 350 and the sixth trace 360 correspond to the test reference voltage and the test data voltage, respectively. The seventh trace 370 corresponds to the sense amplifier output (SAO).

When the first output signal P[0] has a low voltage level and the remaining output signals P[1]. P[2] have high voltage levels (e.g., when the first degeneration transistor 252 is activated and the second and third degeneration transistors 254, 256 are deactivated), the test data voltage has a lower voltage level than the test reference voltage. During this scenario (e.g., test code "011"), when the sense amplifier enable signal (SAE) has a high voltage level, the sense amplifier output (SAO) remains constant (e.g., does not toggle).

When the second output signal P[1] has a low voltage level and output signals P[0], P[2] have high voltage levels (e.g., when the second degeneration transistor 254 is activated and the first and third degeneration transistors 252, 256 are deactivated), the test data voltage increases. However, the test data voltage remains at a lower voltage level than the test reference voltage. During this scenario (e.g., test code "101"), when the sense amplifier enable signal (SAE) has a high voltage level, the sense amplifier output (SAO) remains constant (e.g., does not toggle).

When the third output signal P[2] has a low voltage level and output signals P[0], P[1] have high voltage levels (e.g., when the third degeneration transistor 256 is activated and the first and second degeneration transistors 252, 254 are deactivated), the test data voltage increases to a higher voltage level than the test reference voltage. During this scenario (e.g., test code "110"), when the sense enable signal (SAE) has a high voltage level, the sense amplifier output (SAO) toggles. For example, the sense amplifier output (SAO) may toggle when the test data voltage increases from less than the test reference voltage to greater than the test reference voltage, transitioning across a state where the test data voltage and the test reference voltage are substantially equal. Thus, the offset compensation code may correspond to a code (e.g., test code "110") that, when provided to the plurality of latches 204, causes the third degeneration transistor 256 to activate and the first and second degeneration transistors 252, 254 to deactivate, generating an offset current that substantially compensates for voltage offsets in the sense amplifier 201.

In a particular embodiment, the test mode control circuit 202 may perform a linear scan of different test codes to determine the offset compensation code. For example, the test mode control circuit 202 may initialize with a low binary code (e.g., test code "000") and increment the test codes by a single binary value (or multiple binary values) until the offset compensation code is determined. Alternatively, the test mode control circuit 202 may initialize with a high binary code (e.g., test code "111") and decrement the test codes by a single binary value (or multiple binary values) until the offset compensation code is determined. Initializing with the low binary code and initializing with the high binary code may result in two different offset compensation codes. Thus, test code "110" may correspond to the offset compensation code when initializing with the low binary code, and test code "101" may correspond to the offset compensation code when initializing with the high binary code. In another particular embodiment, the test mode control circuit 202 may perform a non-linear scan of different test codes to determine the offset compensation code. As a non-limiting example, the test mode control circuit 202 may initialize with a binary code (e.g., test code "100") between the low binary code and the high binary code and selectively increment and decrement the test codes until the offset compensation code is determined.

In a particular embodiment, each degeneration transistor 252-258 may have substantially similar characteristics (e.g., similar sizes) enabling a substantially equal current to propagate through each degeneration transistor 252-258 upon activation. In another embodiment, each degeneration transistor 252-258 may have different characteristics enabling different currents to propagate through each degeneration transistor 252-258 upon activation and relative sizes of the degeneration transistors 252-258 may correspond to a "significance" of corresponding bits in the test code. For example, a transistor size for the second output signal P[1] may be twice the transistor size for the first output signal P[0], and the transistor size for the third output signal P[2] may be twice the transistor size for the second output signal P[1], etc. The first degeneration transistor 252 may enable propagation of a first current, the second degeneration transistor 254 may enable propagation of a second current that has a larger magnitude than the first current, etc.

Figure 4:
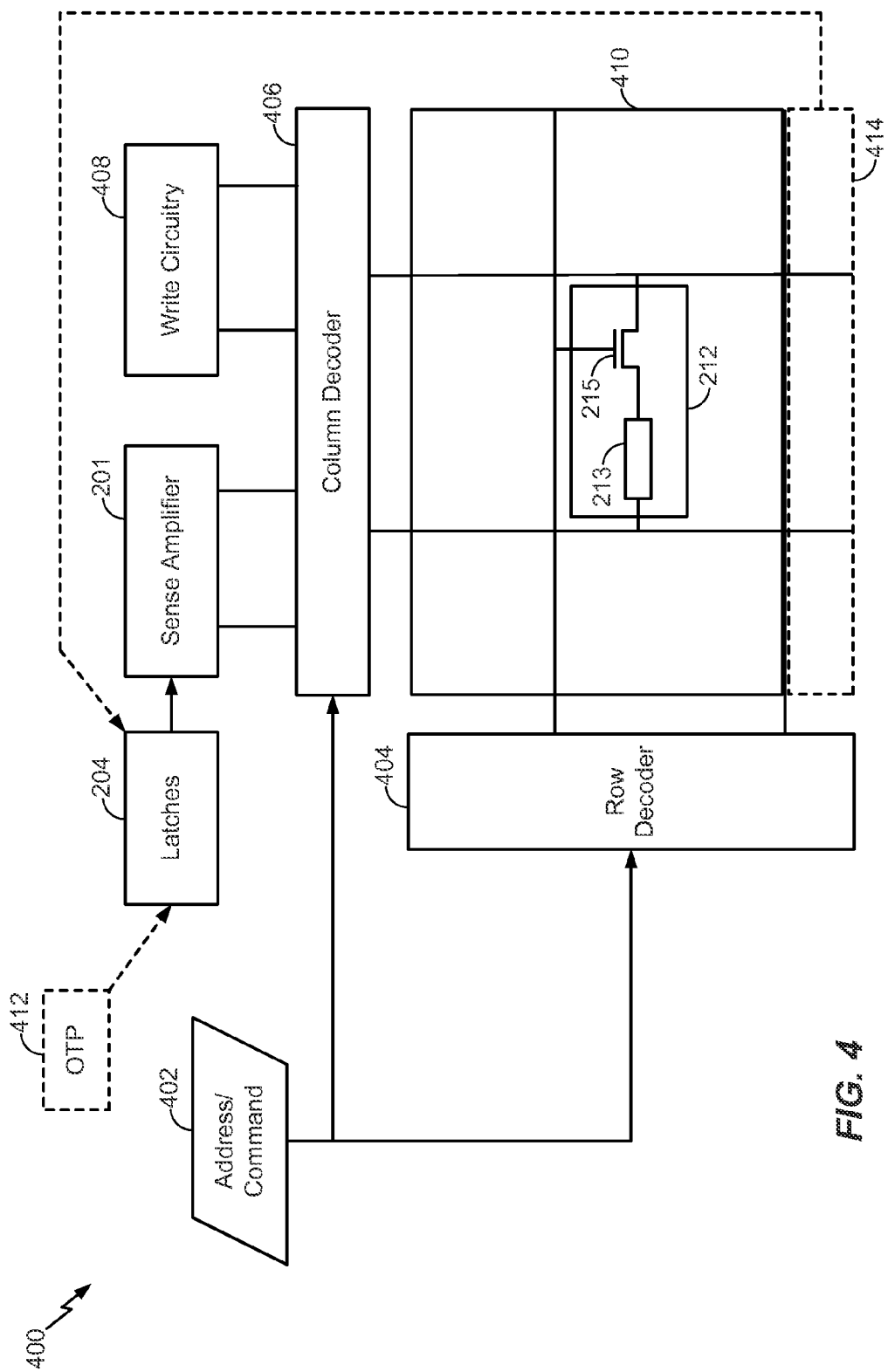
FIG. 4 is a block diagram of a particular illustrative embodiment of a memory system that is operable to provide an offset compensation code to a plurality of latches.

Referring to FIG. 4, a particular illustrative embodiment of a memory system 400 that is operable to provide an offset compensation code to a plurality of latches is shown. The memory system 400 includes the plurality of latches 204, the sense amplifier 201, a row decoder 404, a column decoder 406, write circuitry 408, and a first data array 410. In a particular embodiment, the memory system 400 may include a one-time-programmable (OTP) memory 412 to store an offset compensation code. In another particular embodiment, the memory system 400 may include a second data array 414 to store an offset compensation code.

The row decoder 404 and the column decoder 406 are configured to receive an address and a command (hereinafter an instruction 402) to read data from a data cell in the first data array 410 or to write data to a data cell in the first data array 410. For example, the row decoder 404 and the column decoder 406 may receive an instruction 402 to write data to the data cell 212 of FIG. 2 in the first memory array 410. The row decoder 404 may identify the particular row in the first memory array 410 where the data cell 212 is located and the column decoder 406 may identify the particular column in the first memory array 410 where the data cell 212 is located. In response to identifying the particular row and column, the write circuitry 408 may write data to the data cell 212. For example, the write circuitry 408 may provide a write current to the programmable resistance based memory element 213 to write either a logical "1" or a logical "0" to the data cell 112.

The row decoder 404 and the column decoder 406 may also receive an instruction 402 to read data from the data cell 212. During a power on-sequence (e.g., a test mode), the memory system 400 may determine an offset compensation code to reduce a voltage offset due to manufacturing process variations of components in the sense amplifier 201. For example, in a substantially similar manner as described with respect to the memory systems 100-200 of FIGS. 1-2, different test codes may be provided to the plurality of latches 204 to determine a test code (e.g., an offset compensation code) that causes an output of the sense amplifier 201 to toggle. The output of the sense amplifier 201 may toggle when a test data voltage increases from less than a test reference voltage to greater than the test reference voltage, transitioning across a state where the test data voltage and the test reference voltage are substantially equal. In a particular embodiment, the offset compensation code may be stored in the OTP memory 412. In another particular embodiment, the offset compensation code may be stored in the second data array 414.

During operation of the memory system 400 in a sensing mode, the offset compensation code may be provided to the plurality of latches 204 from either the OTP memory 412 or the second data array 414 to enable selected degeneration transistors to produce a current (e.g., an offset current) that is substantially similar to the current that caused the test data voltage to substantially equal the test reference voltage. For example, the offset compensation code may be serially shifted into the plurality of latches 204 from either the OTP memory 412 or from the second data array 414. The offset current may be provided to the programmable resistance based memory element 213. A data voltage may be generated based on the offset current and the resistance of the programmable resistance based memory element 213. A reference voltage may be generated. For example, the reference voltage may be based on the resistance of the reference resistance based memory element 223 of FIG. 2. A comparator may compare the data voltage to the reference voltage to determine a logical value of the data cell 212.

Figure 5:
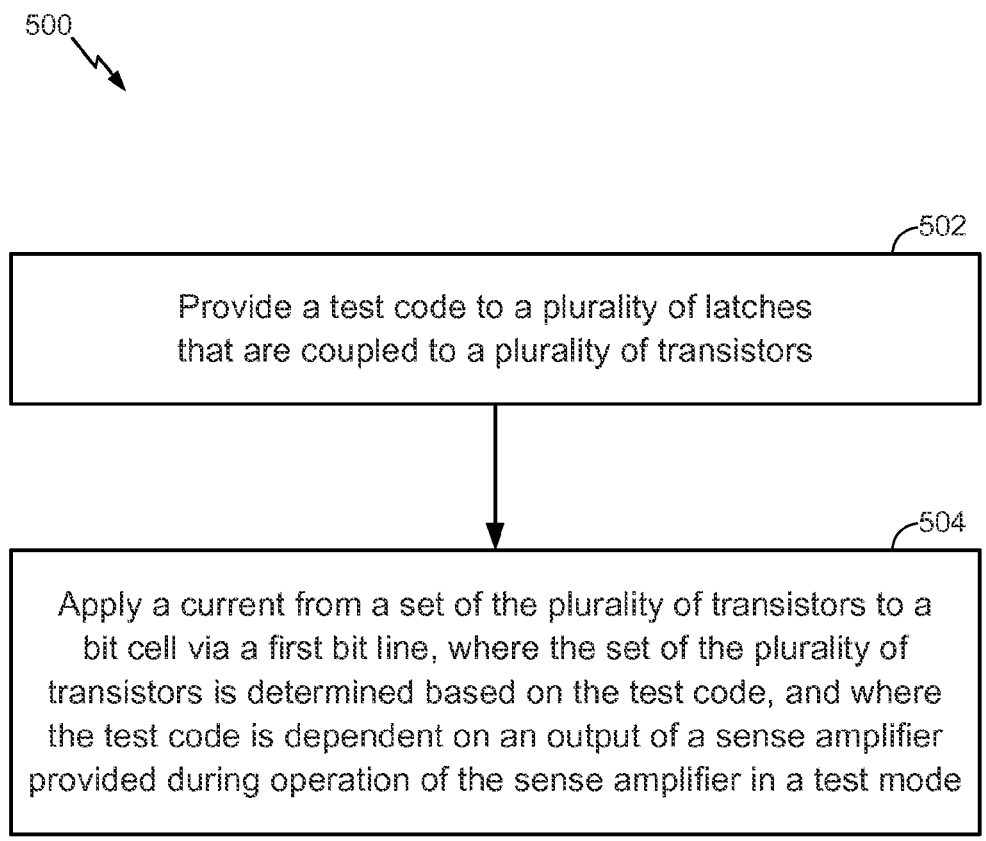
FIG. 5 is a flowchart of a particular illustrative embodiment of a method to reduce or cancel a voltage offset during sensing operations.

Referring to FIG. 5, a particular illustrative embodiment of a method 500 to reduce or cancel a voltage offset during sensing operations is shown. The method 500 may be performed by the memory system 100 of FIG. 1, the memory system 200 of FIG. 2, the memory system 400 of FIG. 4, or any combination thereof.

The method 500 includes providing a test code to a plurality of latches that are coupled to a plurality of transistors, at 502. For example, in FIG. 1, the offset compensation code may be provided (e.g., serially shifted) to the plurality of latches 104. The plurality of latches 104 may provide corresponding voltage signals to a set of transistors in the trimming circuit 106 to produce a current (e.g., an offset current) that is substantially similar to the current that caused the test data voltage to substantially equal the test reference voltage.

A current from a set of the plurality of transistors may be applied to a bit cell via a first bit line, at 504. For example, in FIG. 1, the set of the plurality of transistors may provide the offset current to the data cell 112 via the first bit line 110. A data voltage may be generated based on the offset current and a resistance of the programmable resistance based memory element in the data cell 112. A reference voltage may be generated based on the resistance of the reference resistance based memory element in the reference cell 122 and the current provided via the second bit line 120. The comparator 140 may compare the data voltage to the reference voltage to determine a logical value of the data cell 112. The set of the plurality of transistors may be determined based on the test code. For example, in FIG. 2, particular DFFs 242-248 may provide low voltage signals to corresponding transistors 252-258 based on the offset compensation code. The offset compensation code may be dependent on an output of the sense amplifier provided during operation of the sense amplifier in a test mode. For example, in FIG. 3, the offset compensation code may correspond to a code that makes the sense amplifier output (SAO) toggle, as illustrated in the seventh trace 370.

In a particular embodiment, the method 500 may include storing the offset compensation code in a one-time programmable memory during operation in the test mode. For example, in FIG. 4, the offset compensation code may be stored in the OTP memory 412. The method 500 may also include transferring the offset compensation code to the plurality of latches during operation in a sensing mode. For example, in FIG. 4, the offset compensation code may be transferred (e.g., serially shifted) from the OTP memory 412 to the plurality of latches 204.

In a particular embodiment, the method 500 may include storing the offset compensation code in a magnetoresistive random-access memory (MRAM) cell array during operation in the test mode. For example, in FIG. 4, the offset compensation code may be stored in the second data array 414. The method 500 may also include transferring the offset compensation coded to the plurality of latches during operation in a sensing mode. For example, in FIG. 4, the offset compensation code may be transferred (e.g., serially shifted) from the second data array 414 to the plurality of latches 204.

In a particular embodiment, the method 500 may include storing the offset compensation code in the plurality of latches. For example, in FIG. 2, the offset compensation code may be stored in the plurality of latches 204.

In a particular embodiment, the offset compensation code may be determined by sweeping through a plurality of test codes and monitoring the output of the sense amplifier during operation in a test mode. For example, in FIG. 1, the test mode control circuit 102 may sweep through a plurality of test codes and monitor the output of the sense amplifier 101 to determine which test code results in the output toggling. During the sweep operation, the test mode control circuit 102 may initialize using a test code having a low value and increment the test code until the output of the sense amplifier 101 toggles. Alternatively, the test mode control circuit 102 may initialize using a test code having a high value and decrement the test code until the output of the sense amplifier 101 toggles. In yet another embodiment, the test mode control circuit 102 may initialize using a test code having a particular value and selectively increment and/or decrement the test code until the output of the sense amplifier 101 toggles.

The method 500 may remove or reduce a voltage offset due to manufacturing process variations of components in the sense amplifier 101. For example, using the test codes to vary (e.g., increase or decrease) the current provided to the data cell 112 may eliminate or reduce a voltage offset that may otherwise be present. During operation of the memory system 100 in the sensing mode, any voltage offset due to manufacturing process variations of components in the sense amplifier 101 may be reduced or canceled using the offset compensation code determined during the test mode. For example, the test mode control circuit 102 may scan through different test codes 103 until the offset compensation code is determined. The memory system 100 may then switch to sensing mode, and the test mode control circuit 102 may apply the offset compensation code to the plurality of latches 104 to reduce voltage offsets in the sense amplifier 101.

Figure 6:
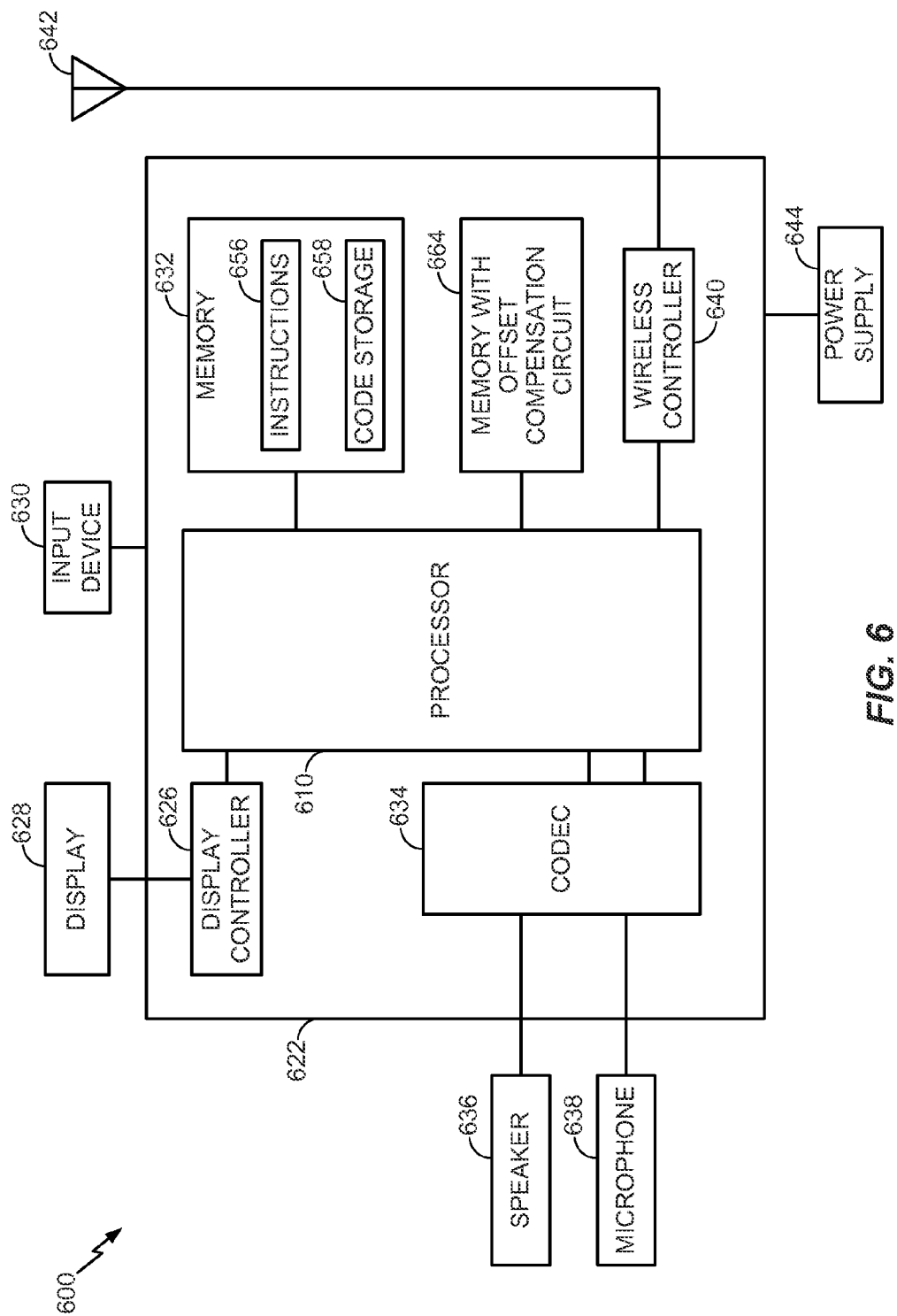
FIG. 6 is a block diagram of wireless device including a memory with an offset compensation circuit.

Referring to FIG. 6, a block diagram of a particular illustrative embodiment of a wireless communication device is depicted and generally designated 600. The wireless communication device 600 includes a processor 610, such as a digital signal processor (DSP), coupled to a memory 632. The wireless communication device 600 may include a memory with an offset compensation circuit 664. In an illustrative embodiment, the memory with the offset compensation circuit 664 may correspond to the memory system 100 of FIG. 1, the memory system 200 of FIG. 2, the memory system 400 of FIG. 4, or any combination thereof.

The memory 632 may be a non-transitory computer readable medium storing computer-executable instructions 656 that are executable by the processor 610 (e.g., a computer) to cause the processor 610 to provide a test code to a plurality of latches that are coupled to a plurality of transistors. For example, the computer-executable instructions 656 may include instructions to provide a test code to a plurality of latches that are inside the memory with the offset compensation circuit 664. In addition, the memory 632 may include a section that is used as a code storage 658 including an offset compensation code storage.

FIG. 6 also shows a display controller 626 that is coupled to the processor 610 and to a display 628. A coder/decoder (CODEC) 634 can also be coupled to the processor 610. A speaker 636 and a microphone 638 can be coupled to the CODEC 634.

FIG. 6 indicates that a wireless controller 640 can be coupled to the processor 610 and to a wireless antenna 642. In a particular embodiment, the processor 610, the memory with the offset compensation circuit 664, the display controller 626, the memory 632, the CODEC 634, and the wireless controller 640 are included in a system-in-package or system-on-chip device 622. In a particular embodiment, an input device 630 and a power supply 644 are coupled to the system-on-chip device 622. Moreover, in a particular embodiment, as illustrated in FIG. 6, the display 628, the input device 630, the speaker 636, the microphone 638, the wireless antenna 642, and the power supply 644 are external to the system-on-chip device 622. However, each of the display 628, the input device 630, the speaker 636, the microphone 638, the wireless antenna 642, and the power supply 644 can be coupled to a component of the system-on-chip device 622, such as an interface or a controller.

While FIG. 6 illustrates a particular embodiment of a wireless device 600, one or more memories (e.g., the memory with the offset compensation circuit 664) may be integrated in other electronic devices including a set top box, a music player, a video player, an entertainment unit, a navigation device, a communications device, a personal digital assistant (PDA), a fixed location data unit, and a computer.

In conjunction with the described embodiments, an apparatus is disclosed that may include means for latching a test code. For example, the means for latching the test code may include the plurality of latches 104 of FIG. 1, the plurality of latches 204 of FIG. 2, the processor 610 programmed to execute the instructions 656 of FIG. 6, the memory with the offset compensation circuit 664 of FIG. 6, one or more other devices, circuits, modules, or instructions to latch the test code.

The apparatus may also include means for providing a current to a first bit line to read a bit cell via based on the latched test code. For example, the means for providing the current may include the trimming circuit 106 of FIG. 1, the trimming circuit 206 of FIG. 2, the processor 610 programmed to execute the instructions 656 of FIG. 6, the memory with the offset compensation circuit 664 of FIG. 6, one or more other devices, circuits, modules, or instructions to provide the current.

Figure 7:
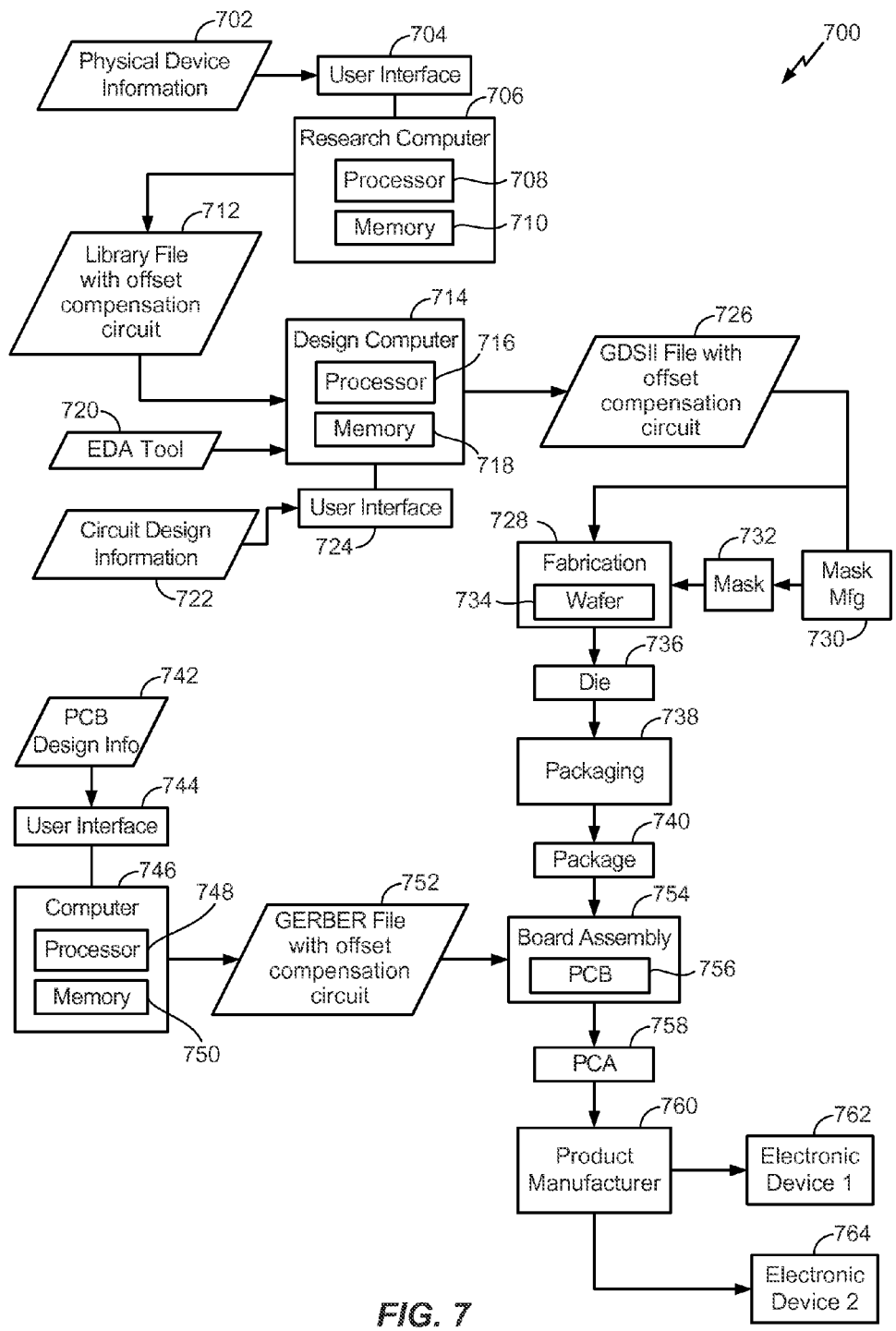
FIG. 7 is a data flow diagram of a particular illustrative embodiment of a manufacturing process to manufacture electronic devices that include a memory with an offset compensation circuit.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 7 depicts a particular illustrative embodiment of an electronic device manufacturing process 700.

Physical device information 702 is received at the manufacturing process 700, such as at a research computer 706. The physical device information 702 may include design information representing at least one physical property of a semiconductor device, such as a semiconductor device that includes the components of the memory system 100 of FIG. 1, the components of the memory system 200 of FIG. 2, the components of the memory system 400 of FIG. 4, or any combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including a device that the components of the memory system 100 of FIG. 1, the components of the memory system 200 of FIG. 2, the components of the memory system 400 of FIG. 4, or any combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit including the components of the memory system 100 of FIG. 1, the components of the memory system 200 of FIG. 2, the components of the memory system 400 of FIG. 4, or any combination thereof, of the library file 712. For example, a user of the design computer 714 may enter circuit design information 722 via a user interface 724 coupled to the design computer 714. The circuit design information 722 may include design information representing at least one physical property of a semiconductor device, such as a device including the components of the memory system 100 of FIG. 1, the components of the memory system 200 of FIG. 2, the components of the memory system 400 of FIG. 4, or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing the components of the memory system 100 of FIG. 1, the components of the memory system 200 of FIG. 2, the components of the memory system 400 of FIG. 4, or any combination thereof, in addition to other circuits or information. To illustrate, the data file may include information corresponding to a system-on-chip (SOC) that includes the components of the memory system 100 of FIG. 1, the components of the memory system 200 of FIG. 2, the components of the memory system 400 of FIG. 4, or any combination thereof, and that also includes additional electronic circuits and components within the SOC.

The GDSII file 726 may be received at a fabrication process 728 to manufacture the components of the memory system 100 of FIG. 1, the components of the memory system 200 of FIG. 2, the components of the memory system 400 of FIG. 4, or any combination thereof, or any combination thereof, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, which may be tested and separated into dies, such as a representative die 736. The die 736 includes circuits that include the components of the memory system 100 of FIG. 1, the components of the memory system 200 of FIG. 2, the components of the memory system 400 of FIG. 4, or any combination thereof, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the components of the memory system 100 of FIG. 1, the components of the memory system 200 of FIG. 2, the components of the memory system 400 of FIG. 4, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the components of the memory system 100 of FIG. 1, the components of the memory system 200 of FIG. 2, the components of the memory system 400 of FIG. 4, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a set top box, a music player, a video player, an entertainment unit, a navigation device, a communications device, a personal digital assistant (PDA), a fixed location data unit, and a computer, into which the components of the memory system 100 of FIG. 1, the components of the memory system 200 of FIG. 2, the components of the memory system 400 of FIG. 4, or any combination thereof is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these illustrated units. Embodiments of the disclosure may be suitably employed in any device that includes active integrated circuitry including memory and on-chip circuitry.

A device that includes the circuit 100 of FIG. 1, the components of the memory system 100 of FIG. 1, the components of the memory system 200 of FIG. 2, the components of the memory system 400 of FIG. 4, or any combination thereof, may be fabricated, processed, and incorporated into an electronic device, as described in the illustrative process 700. One or more aspects of the embodiments disclosed with respect to FIGS. 1-6 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
   a plurality of transistors responsive to a plurality of latches that store a test code;
   a first bit line coupled to a data cell and coupled to a sense amplifier;
   a second bit line coupled to a reference cell and coupled to the sense amplifier, wherein a current from a set of the plurality of transistors is applied to the data cell via the first bit line, and wherein the set of the plurality of transistors is determined based on the test code; and
   a test mode reference circuit coupled to the first bit line and to the second bit line.

2. The circuit of claim 1, wherein the test code comprises logic one values and logic zero values, and wherein each of the logic zero values triggers conduction of a transistor of the plurality of transistors.

3. The circuit of claim 1, further comprising a test mode control circuit configured to provide a series of test codes to the plurality of latches to determine a characteristic of the sense amplifier.

4. The circuit of claim 3, wherein the test mode control circuit determines an offset compensation code, wherein the offset compensation code corresponds to a particular test code of the series of test codes, and wherein the particular test code causes the output of the sense amplifier to change a state.

5. The circuit of claim 3, wherein the test mode reference circuit includes:
a first test mode resistor coupled to the first bit line via a first selection transistor; and
a second test mode resistor coupled to the second bit line via a second selection transistor, wherein the first test mode resistor and the second test mode resistor have substantially equal resistances;
wherein, during operation in a test mode, each test code of the series of test codes corresponds to a different current that is provided to the first test mode resistor.

6. The circuit of claim 5, wherein the data cell and the reference cell are isolated from the sense amplifier during operation in the test mode.

7. The circuit of claim 5, wherein the test code is determined based on an output of the sense amplifier during operation in the test mode.

8. The circuit of claim 1, integrated in at least one semiconductor die.

9. The circuit of claim 1, further comprising a device selected from the group consisting of a set top box, a music player, a video player, an entertainment unit, a navigation device, a communications device, a personal digital assistant (PDA), a fixed location data unit, and a computer, into which the sense amplifier is integrated.

10. The circuit of claim 1, wherein the data cell is a memory cell within one of a magnetoresistive random access-memory (MRAM), a phase change random access memory (PRAM), a spin-transfer torque magnetoresistive random-access memory (STT-MRAM), a ferroelectric random-access memory (FRAM), or a resistive random-access memory (ReRAM).

11. A method comprising:
providing a test code to a plurality of latches that are coupled to a plurality of transistors; and
applying a current from a set of the plurality of transistors to a bit cell via a first bit line, wherein the set of the plurality of transistors is determined based on the test code, and wherein the test code is determined based on an output of a sense amplifier provided during operation of the sense amplifier in a test mode.

12. The method of claim 11, wherein the test code is provided to the plurality of latches by serially shifting the test coded into the plurality of latches.

13. The method of claim 11, wherein an offset compensation code is determined, during operation in the test mode, by sweeping through a plurality of test codes and monitoring the output of the sense amplifier.

14. The method of claim 13, further comprising storing the offset compensation code in the plurality of latches.

15. The method of claim 13, further comprising:
storing the offset compensation code in a one-time programmable memory during operation in the test mode; and
transferring the offset compensation code to the plurality of latches during operation in a sensing mode.

16. The method of claim 13, further comprising:
storing the offset compensation code in a magnetoresistive random-access memory (MRAM) cell array during operation in the test mode; and
transferring the offset compensation code to the plurality of latches during operation in a sensing mode.

17. The method of claim 11, wherein providing the test code to the plurality of latches is performed by a processor integrated into an electronic device.

18. An apparatus comprising:
means for latching a test code; and
means for providing a current to a first bit line to read a bit cell via based on the test code, wherein the test code is determined based on an output of a sense amplifier provided during operation of the sense amplifier in a test mode.

19. The apparatus of claim 18, further comprising means for providing the test code to the means for latching, wherein the test code is provided to the means for latching by serially shifting the test code into the means for latching.

20. The apparatus of claim 18, further comprising a device selected from the group consisting of a set top box, a music player, a video player, an entertainment unit, a navigation device, a communications device, a personal digital assistant (PDA), a fixed location data unit, and a computer, into which the means for latching the test code and the means for providing the current are integrated.

21. A computer-readable storage medium comprising instructions that, when executed by a processor, cause the processor to:
provide a test code to a plurality of latches that are coupled to a plurality of transistors;
wherein a set of the plurality of transistors applies current via a first bit line to a bit cell in response to receiving signals from the plurality of latches based on the test code, wherein the set of the plurality of transistors is determined based on the test code, and wherein the test code is determined based on an output of a sense amplifier provided during operation of the sense amplifier in a test mode.

22. The computer-readable storage medium of claim 21, wherein the test code is provided to the plurality of latches by serially shifting the test coded into the plurality of latches.

23. The computer-readable storage medium of claim 21, wherein the processor is integrated into a device selected from the group consisting of a set top box, a music player, a video player, an entertainment unit, a navigation device, a communications device, a personal digital assistant (PDA), a fixed location data unit, and a computer.

24. A method comprising:
receiving design information representing at least one physical property of a semiconductor device, the semiconductor device comprising:
a plurality of transistors responsive to a plurality of latches that store a test code;
a first bit line coupled to a data cell and coupled to a sense amplifier;
a second bit line coupled to a reference cell and coupled to the sense amplifier, wherein a current from a set of the plurality of transistors is applied to the data cell via the first bit line, and wherein the set of the plurality of transistors is determined based on the test code; and
a test mode reference circuit coupled to the first bit line and to the second bit line;
transforming the design information to comply with a file format; and generating a data file including the transformed design information.

25. The method of claim 24, wherein the data file comprises a GDSII format.

26. The method of claim 24, wherein the data file comprises a GERBER format.

27. A method comprising:
a step for providing a test code to a plurality of latches that are coupled to a plurality of transistors; and
a step for applying a current from a set of the plurality of transistors to a bit cell via a first bit line, wherein the set of the plurality of transistors is determined based on the test code, and wherein the test code is determined based on an output of a sense amplifier provided during operation of the sense amplifier in a test mode.

* * * * *